(12) United States Patent
Fujimura et al.

(10) Patent No.: US 8,475,058 B2  
(45) Date of Patent: Jul. 2, 2013

(54) OPTICAL MODULE WITH CERAMIC PACKAGE REDUCING OPTICAL COUPLING STRESS

(75) Inventors: Yasushi Fujimura, Yokohama (JP); Toshio Takagi, Yokohama (JP); Fumihiro Nakajima, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/858,997

(22) Filed: Aug. 18, 2010

(65) Prior Publication Data

US 2012/0045183 A1 Feb. 23, 2012

(51) Int. Cl.  
*G02B 6/36* (2006.01)

(52) U.S. Cl.  
USPC .................. 385/93; 385/14; 385/89; 385/94

(58) Field of Classification Search  
None  
See application file for complete search history.

(56) References Cited

U.S. PATENT DOCUMENTS

| | | | | |
|---|---|---|---|---|
| 3,301,430 | A | * | 1/1967 | Cornelius ..................... 312/405 |
| 3,417,897 | A | * | 12/1968 | Johnson ..................... 220/254.3 |
| 5,152,411 | A | * | 10/1992 | Pope et al. ..................... 215/381 |
| 5,678,935 | A | | 10/1997 | Sakata |
| 7,118,292 | B2 | * | 10/2006 | Miao et al. ..................... 385/88 |
| 7,324,716 | B2 | | 1/2008 | Epitaux |
| 7,476,040 | B2 | | 1/2009 | Zack et al. |
| 2005/0129372 | A1 | * | 6/2005 | Zheng ............................. 385/94 |
| 2005/0214957 | A1 | * | 9/2005 | Kihara et al. ................... 438/14 |
| 2006/0018609 | A1 | * | 1/2006 | Sonoda et al. .................. 385/93 |

* cited by examiner

*Primary Examiner* — Ryan Lepisto  
*Assistant Examiner* — Andrew Jordan  
(74) *Attorney, Agent, or Firm* — Venable LLP; Michael A. Sartori; Tamatane J. Aga

(57) ABSTRACT

An optical module with an arrangement is disclosed in which the module has the LD, the TEC, and the lens with the lens carrier also mounted on the TEC. The signal light from the LD is concentrated by the lens and reflected by the mirror each assembled with the lens carrier mounted on the TEC. The TEC is mounted on the bottom metal that covers the bottom of the ceramic package, the first layer of which is widely cut to set the TEC therein. The FPC is coupled in at least two edges of the first ceramic layer left from the cut.

8 Claims, 19 Drawing Sheets

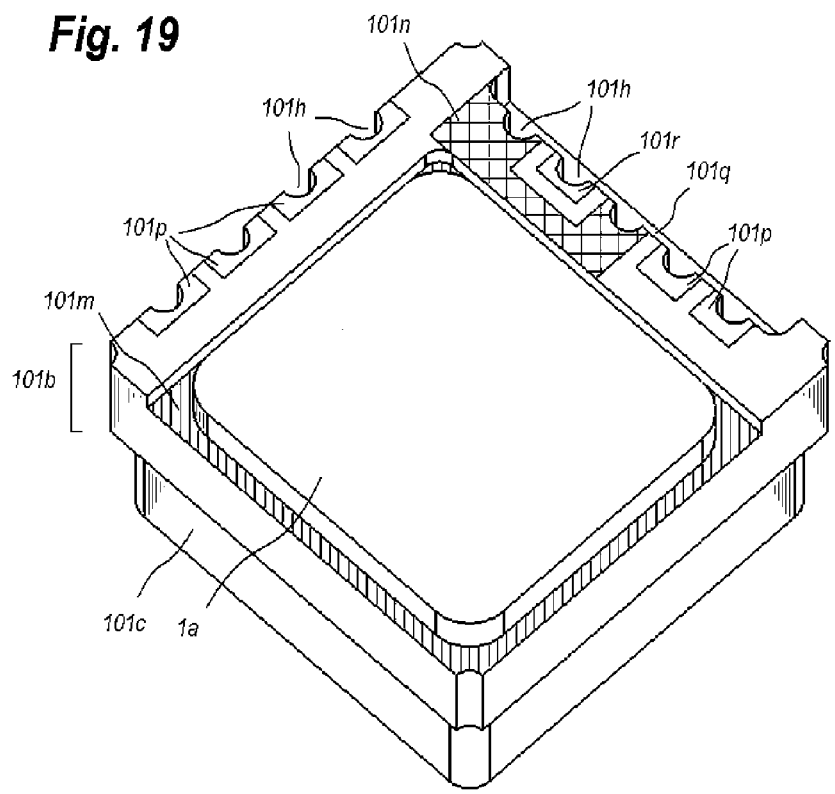

OPTICAL MODULE WITH CERAMIC PACKAGE REDUCING OPTICAL COUPLING STRESS

BACKGROUND OF THE INVENTION

1. Field of the Invention

The present invention relates to an optical module providing a multi-layered ceramic package.

2. Related Prior Art

Conventional and typical optical module installs a semiconductor laser diode (hereafter denoted as LD) as a source of signal light and a lens to couple the signal light with an external fiber. Some optical modules provide a function to control a temperature of the LD to secure the quality of the signal light. In such an optical module with the temperature control function, a thermo-electric controller (hereafter denoted as TEC) is installed in the package to mount the LD thereon and the signal light to be extracted by being bent the optical axis thereof by, for instance, a mirror.

Recently, in addition to two primary arrangements of, what is called, a co-axial type and a butterfly type, an optical module with the third configuration has been proposed as disclosed in the U.S. Pat. No. 7,476,040, in which the module as a multi-layered ceramic package and optical coupling members are attached to the lid (ceiling) of the package. In such an optical module, an inner space where electrical and optical components are to be installed therein is severely restricted compared to those of conventional arrangements. The position of the lens, that of the optical filter or the mirror, that of a monitoring photodiode (hereafter denoted as MPD) to detect a portion of the signal light emitted from the LD, and so on are necessary to be carefully designed in connection with the position of the LD. The design of the practical module with such a new arrangement is also consistent with a cost including the productivity thereof. The present invention is to provide a new arrangement of an optical module with the multi-layered ceramic package and the TEC installed therein.

SUMMARY OF THE INVENTION

The optical module of the present invention may comprise an LD, a TEC, and a multi-layered ceramic package including a lid with a cylinder and a ceiling. The ceramic package installs the LD and the TEC therein. The cylinder of the package assembles an optical coupling member that optical couples the external fiber with the LD.

The lid may have a portion, between the cylinder and the ceiling, with a lesser thickness compared with the cylinder and the ceiling, and a periphery also with a lesser thickness compared with the ceiling to be sealed with the seal ring provided in a top of the ceramic package. The portion between the cylinder and the ceiling may absorb the stress affected from the optical coupling member from propagating to the peripheries of the ceiling sealed with the seal ring.

The lid of the invention may provide a hollow in a position corresponding to the cylinder. The hollow may receive a window made of glass or a lens that seal the inner space of the ceramic package. When the lens seals the hollow, the signal light emitted from the LD is first reflected by the mirror and second concentrated by the lens on the external fiber set outside of the lens.

BRIEF DESCRIPTION OF DRAWINGS

The foregoing and other purposes, aspects and advantages will be better understood from the following detailed description of a preferred embodiment of the invention with reference to the drawings, in which:

FIG. 19 is the bottom view of the optical module according to another embodiment of the invention.

DETAILED DESCRIPTION OF PREFERRED EMBODIMENTS

Next, preferred embodiments according to the present invention will be described as referring to accompanying drawings. In the description of the drawings, the same numerals or the same symbols will refer to the same elements without overlapping explanations.

Figure 1:
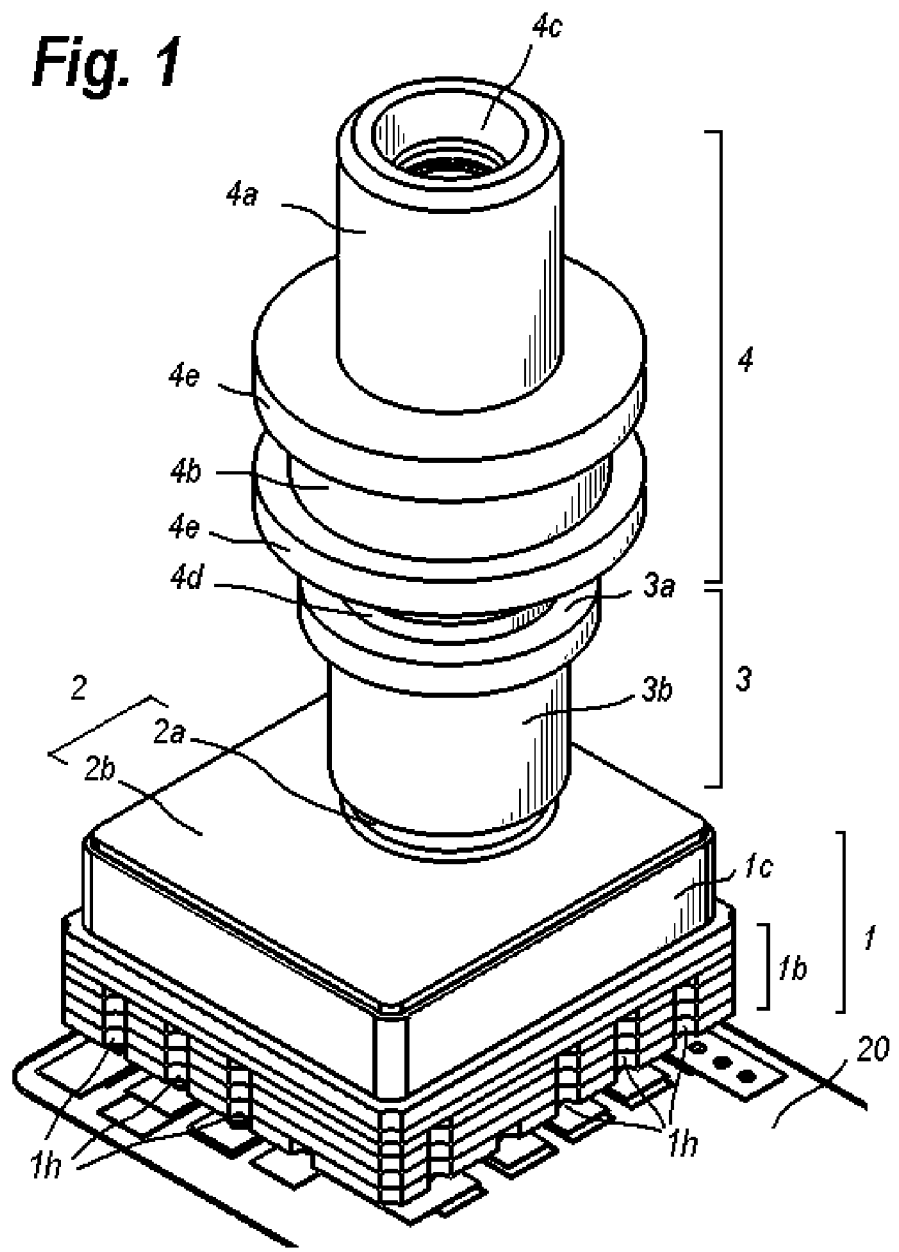
FIG. 1 is a perspective view of an optical subassembly providing an optical module according to an embodiment of the present invention.

An optical subassembly according to an embodiment, as shown in FIG. 1, includes a ceramic package 1, a lid 2, a J-sleeve 3, and a sleeve member 4. The sleeve member 4 includes a cylinder 4a with a bore 4c, two flanges, 4e and a necked portion 4b between the flanges 4e. Receiving a ferrule attached to a tip of an external fiber in the bore 4c to set the position of the external fiber, the optical coupling between the fiber and a device installed in the ceramic package may be realized. The bore 4c passes through the edge flange 4d provided in the other end of the sleeve member 4. Setting the necked portion 4b on a rib or projection provided in, for instance, an optical transceiver that installs the subassembly therein, the position of the optical subassembly within the transceiver may be automatically decided.

The J-sleeve 3, which includes a top 3a and a skirt 3b extending from the top 3a, may optically couple the ceramic package 1 and the sleeve member 4. Specifically, the skirt 3b receives a cylinder portion 2a of the lid 2, and the optical alignment along the optical axis connecting the sleeve member 4 and the ceramic package 1 may be realized by adjusting a depth of the cylinder portion 2a into the skirt 3b. On the other hand, the optical alignment in a plane perpendicular to the optical axis may be carried out by sliding the sleeve member 4 on the top 3a. The end flange 4d and the skirt 3b are welded to the top 3a and the cylinder portion 2a, respectively, after the alignment.

The ceramic package 1 includes a bottom 1a, a multi-layered ceramics 1b, and a seal ring 1c on the top of the ceramic layers 1b. The lid 2 may be made of metal, typically an alloy of iron (Fe) and nickel (Ni); while, the seal ring 1c may be made of Kovar, an alloy of Fe, Ni, and cobalt (Co). A distinguishable feature of the package 1 according to the present embodiment is that the seal ring 1c and the ceramic layers 1b have a nearly same thickness.

Extended from the bottom of the package 1 is an FPC substrate 20. The FPC substrate 20 carries the signal from/to the device in the package 1 and provides the power to the device and, when the package 1 installs a TEC, the power to the TEC. The ceramic package 1 may have a box shape with a size of 5.5×4.5×2.8 (L×W×H) mm$^3$. The seal ring 1c of the present embodiment may have a height of about 1.3 mm, while the ceramic layers may have a height of about 1.5 mm.

Figure 2:
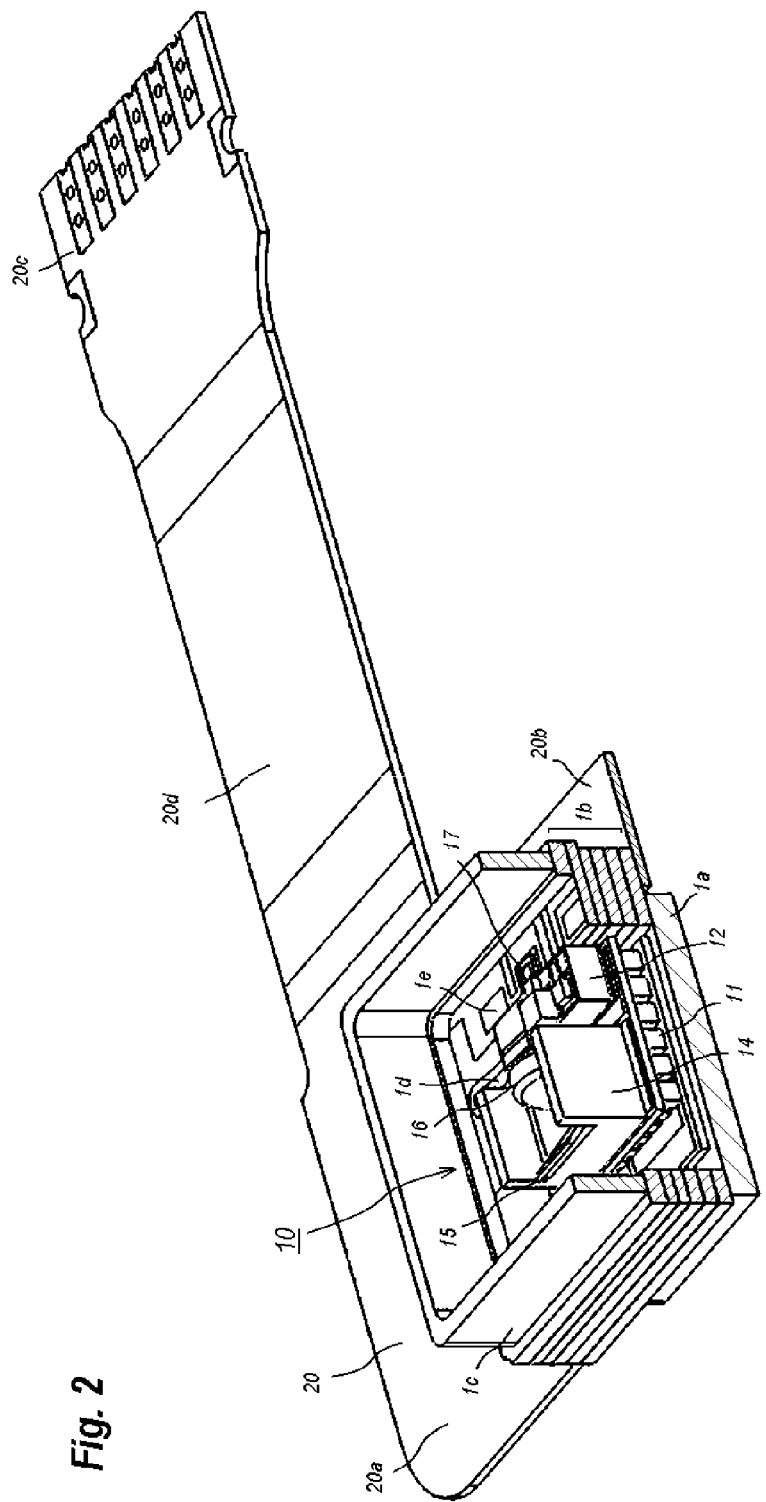
FIG. 2 shows the optical module accompanied with a FPC substrate connected thereto, where the optical module is partially broken to show the inside thereof.
Figure 3:
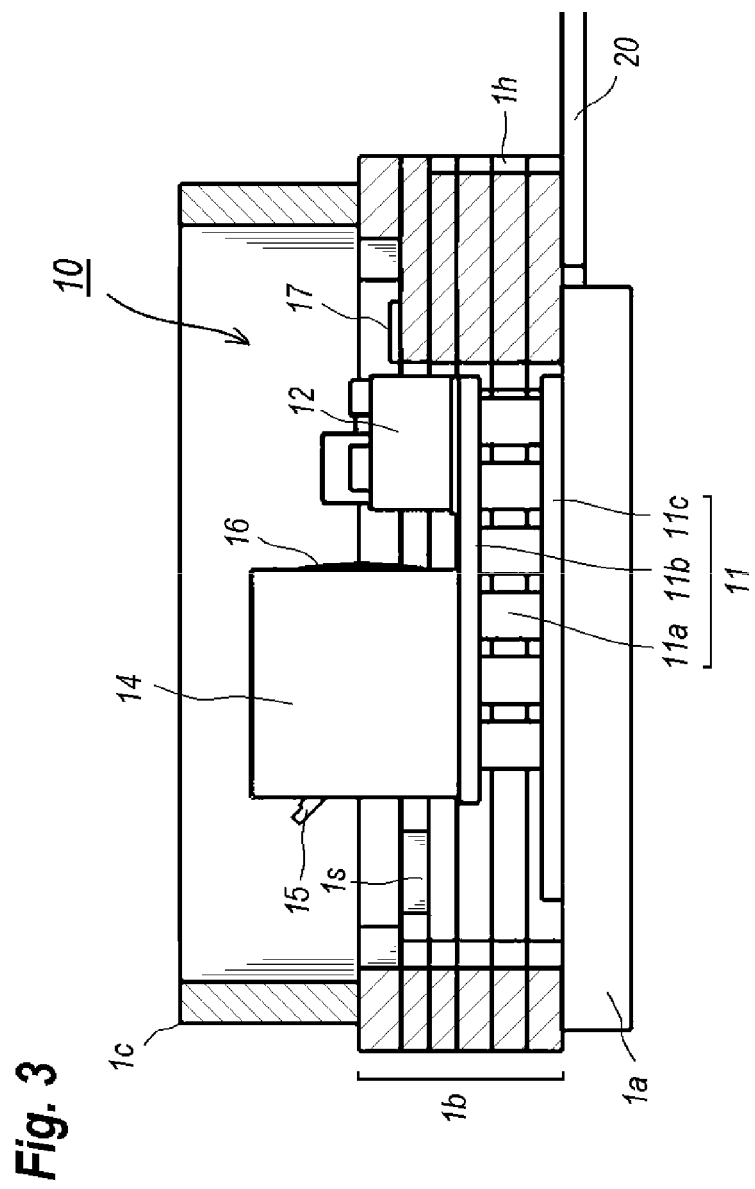
FIG. 3 is a side cross section of the optical module.
Figure 4:
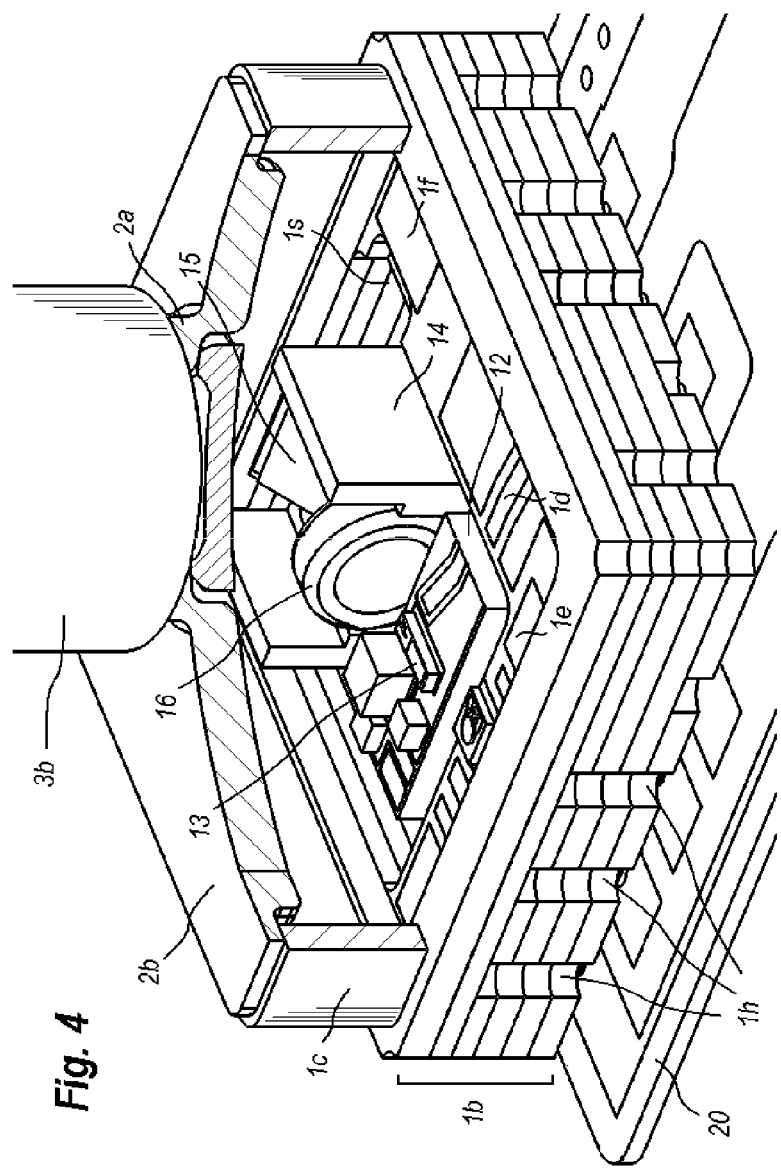
FIG. 4 shows the inside of the optical module.
Figure 5:
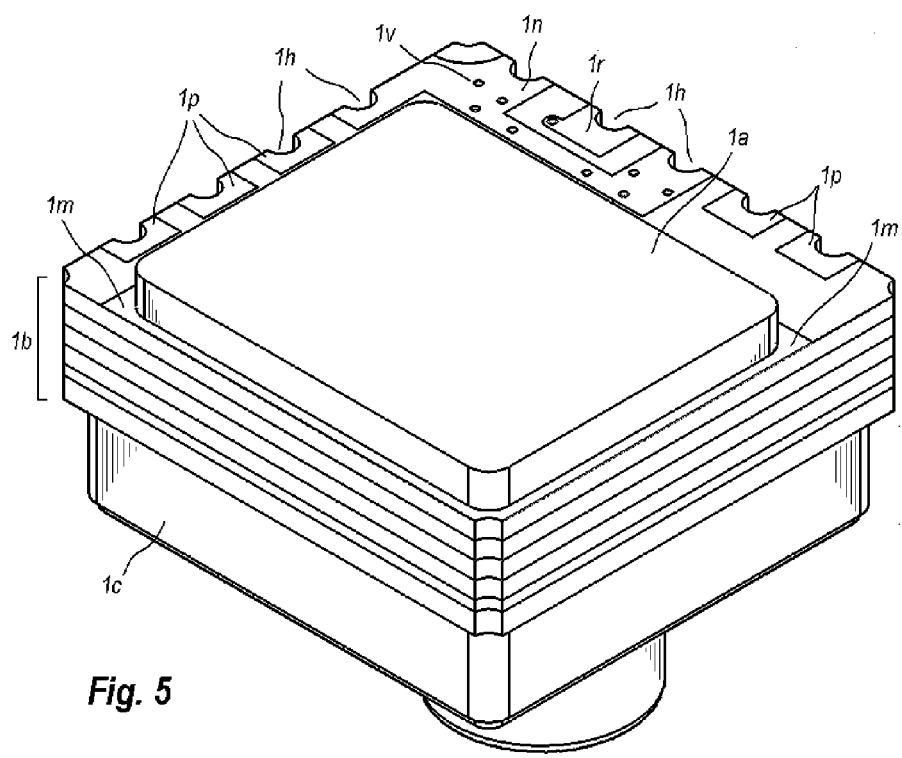
FIG. 5 shows a bottom of the optical module.

FIG. 2 is a perspective view of the optical subassembly with the FPC 20 attached thereto, where FIG. 2 omits the sleeve member 4 and the J-sleeve 3, and a portion of the package 1 thereof is broken to show the inside thereof; FIG. 3 is a side cross section of the package 1; FIG. 4 is a perspective view of the inside of the package 1; and FIG. 5 shows the bottom of the package 1. The FPC 20, which is extended from two sides of the bottom of the package 1, has two ends, 20a and 20b, each attached to respective sides of the package 1, a plurality of pads 20c in the other end of the FPC 20, and an extending portion 20d between both ends. Flexibly bending the extending portion 20d, the FPC 20 may enhance the electrical connectivity of the optical module with the circuit board attached to the pads 20c.

Referring to FIG. 5, the bottom of the package 1 provides the metal 1a with a relatively thick material. The optical module of the present embodiment provides the bottom 1a made of copper and with a thickness of 0.5 mm.

The ceramic layers 1b, the seal ring 1c, and the bottom metal 1a forms a space 10 in the package 1, into which a plurality of components are installed. The ceramic layers 1b according to the present embodiment has a six layers, where the first to third layers have a substantially same thickness, the fourth and the fifth layers are relatively thinner, while, the sixth layer is relatively thicker. From the first to the fifth layers provides an opening with a substantially same shape, while, only the sixth layer has a wider opening in portions which corresponds to two edges the FPC 20 is attached thereto. Accordingly, staking the first to six layers, two peripheries of the top of the fifth layer is exposed, where a plurality of interconnecting patterns 1d and pads 1e may be formed, or the MPD 17 may be mounted. The sixth layer has a constant width in whole periphery thereof to mount the seal ring 1c thereon.

Although the optical module of the present embodiment provides the bottom metal 1a made of copper, the module is not restricted to those metals. Non-metallic materials with the thermal conductivity thereof comparable to that of copper, copper tungsten (CuW) or copper molybdenum (CuMo) may be applicable to the bottom plate 1a.

Installed within the space 10 are a thermo-electric cooler (TEC) 11, a device carrier 12, a semiconductor optical device 13, a mirror carrier 14, a mirror 15, a lens 16, a monitoring photodiode 17, and so on. The optical module according to the embodiment installs a semiconductor laser diode as the semiconductor optical device 13, and is called as a transmitter optical subassembly (TOSA).

The LD 13, which is mounted on the device carrier 12, emits light to a direction of the lens 16 which is substantially parallel to the bottom of the package 1; accordingly, the LD 13 may be a type of, what is called, the edge emitting LD. The LD 13 of the invention may integrate with an optical modulator with a type of, what is called, electro-absorption modulator. In this case, the LD 13 may be a distributed feedback (DFB) LD driven with a DC signal. The MPD 17 detects light emitted from the back facet of the LD 13, where the back is the direction in opposite to the lens 16, and generates a photocurrent corresponding to the optical power of the back facet light. The photocurrent of the MPD 17 is fed back to the control circuit to keep the optical output power of the LD 13 in constant. Mounted on the device carrier 12 is a thermistor that senses a temperature of the LD 13 and a capacitor to eliminate noises superposed on the current to the LD 13. The optical module according to the embodiment may install, what is called, an EA-DFB device that integrates an optical modulator with a DFB (Distributed Feed Back) LD. In this case, the DFB-LD is driven with a stabilized DC current; while, the EA (Electro-Absorption) modulator may be driven with a high frequency signal.

The front facet light emitted from the LD 13 enters the mirror 15 concentrated with the lens 16. The mirror 15 is inclined by 45° with respect to the bottom plane of the package 1, where the mirror 15 may reflect the light coming from the LD 13 toward the direction perpendicular to the bottom plane. Thus, the LD 13 may optically couple with the external fiber provided above the package 1. The optical module according to the embodiment mounts the LD 13 and the thermistor on the device carrier 12; and also the mirror 15 and the lens 16 on the lens carrier 14 are mounted on the TEC 11. Moreover, the TEC 11 is mounted on the bottom metal 1a. As illustrated in FIG. 3, the horizontal level of the MPD 17, which is mounted on the fifth ceramic layer, is lower than the top level of the device carrier 12 mounted on the TEC 11. This arrangement enables that the sensitive surface of the MPD 17 may detect the back facet light of the LD 13, because the light emitted from the LD 13 radially spreads.

The TEC 11 may control a temperature of a material mounted on the top plate thereof by transfer heat between the top and bottom plates. The embodiment installs the LD 13 on the top plate 11b and the TEC 11 may primarily cool the temperature of the LD 13 down, where the bottom plate 11c of the TEC 11 is heated up by the heat transferred from the top plate 11b. Accordingly, it becomes a subject how the heat of the bottom plate 11c may be dissipated outside of the package 1. In the optical module according to the embodiment where the package 1 provides a thick bottom metal 1a made of copper, the heat transferred to the bottom plate 11c may be effectively dissipated by making the surface of the bottom metal 1a to a member provided outside of the package 1.

Referring to FIG. 3, the TEC 11 comprises the top plate 11b, the bottom plate 11c, and a plurality of thermo-electric elements 11a put between the plates, 11b and 11c. Providing a current to the TEC elements 11a each connected in series and having a p-n junction of a semiconductor material, the TEC 11 shows two control modes where the top plate 11b is cooled down, while, the bottom plate 11c is heated up, or the top is heated up and the bottom is cooled down. These two modes may be switched by changing the direction of the current. The electrodes to provide the current are ordinarily formed on the bottom plate 11c to eliminate the heat capacity of components mounted on the top plate 11b, or to isolate the top plate 11b from the heat conducted on the interconnections to the electrodes. The optical module according to the embodiment supplies the current from the electrode 1f formed on the top of the fifth ceramic layer to one of the electrodes on the bottom plate 11c with a bonding wire, and from the other electrode on the fourth ceramic layer exposed within a cutting is of the fifth ceramic layer to the other electrodes on the bottom layer 11c with a bonding wire. Two electrodes on the fifth and fourth ceramic layers are connected to the power pads 1p in the bottom of the package 1 through respective half vias 1h.

Referring to FIG. 5, the bottom metal 1a is offset from a center of the bottom of the package 1. That is, the bottom plate 1a exposes two peripheries of the bottom of the ceramic layer 1b, to which two ends, 20a and 20b, of the FPC 20 are attached. The exposed peripheries of the bottom of the first layer provides a signal pad 1r, a plurality of power pads 1p, and two ground pads, 1m and 1n. These pads, 1n to 1r, accompany with a half via formed in the side of the ceramic layer 1b. Soldering the pad on the FPC 20, the half via 1h may receive surplus solder so as to suppress the excess solder from extending on the FPC 20. The last pad 1m mounts the bottom metal 1a. Two ground pads, in 1m and 1n, may be electrically isolated to each other, and the former pad 1m provides the function of the frame ground, while, the other becomes the signal ground.

Referring to FIG. 4, only the first ceramic layer forms the half via 1h corresponding to the signal pad 1r, while, the half vias for the other pads, 1p and 1n, are formed from the first to the fourth ceramic layers. The signal provided to the signal pad 1r may be carried to the interconnection on the top of the first ceramic layer by being conducted on the metal coating of the half via 1h, put within the ceramic layer by the interconnection, and finally reaches the top interconnection 1d on the fifth ceramic layer by a through hole from the bottom of the second layer to the top of the fifth layer. The through hole above may adjust the characteristic impedance thereof by placing ground vias round it so as to be compatible with the transmission impedance of the interconnections. The characteristic impedance of the top interconnection 1d may be also adjustable by setting the ground pattern on the top of the fourth layer beneath the top interconnection 1d, which forms the configuration of the micro strip line; or by arranging ground lines on both sides of the top interconnection 1d, which emulates the co-planer line. Moreover, the interconnection on the FPC 20 connected to the signal pad 1r may also adjust the characteristic impedance thereof by emulating the micro strip line or the co-planar line. Thus, the optical module with the FPC 20 according to the present embodiment may provide a driving signal to the LD 13 in the package 1 without degrading the signal quality thereof seriously even the driving signal contains high frequency components exceeding 10 Gb/s.

Figure 6:
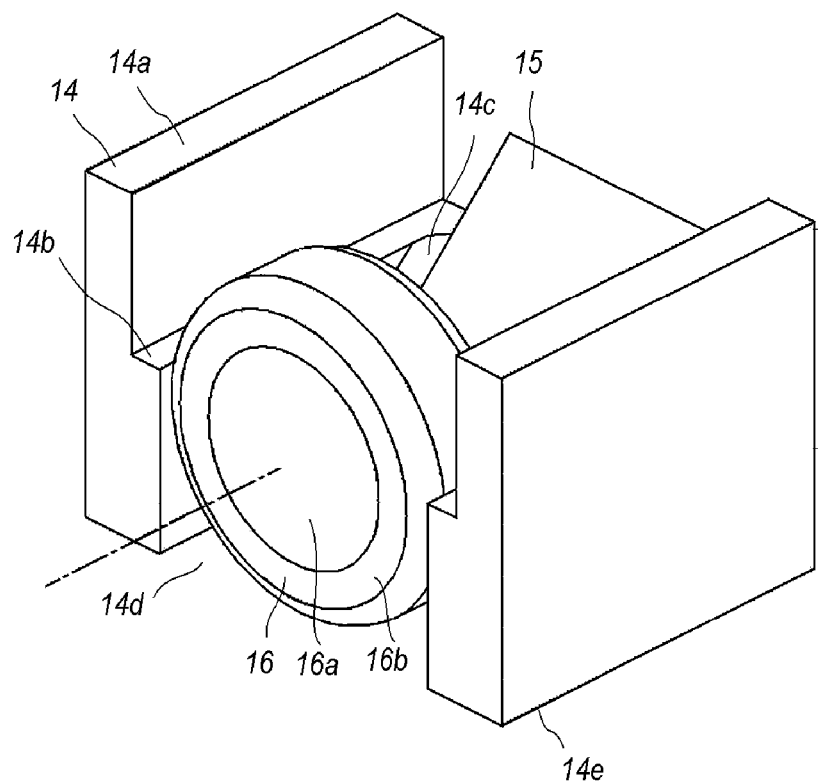
FIG. 6 illustrates a lens carrier installed within the optical module.

FIG. 6 magnifies an assembly of the lens carrier 14 mounting the lens 16 and the mirror 15. The lens carrier 14 includes a pair of side walls 14a and a slope block 14c that connects the side walls 14a and mounts the mirror 15 thereon. The lens 16 is installed in a space 14d in front of the mirror 15 and between the side walls 14a. The side wall 14a forms an inner step 14b in a midway thereof. The inner step 14b may be a portion to receive surplus adhesive to fix the lens 16 to the lens carrier 14.

The lens 16 includes a lens body 16a in a center thereof and a support 16b in a periphery. The outer shape of the periphery is cylindrical with a total width thereof slightly less than a width of the space 14d between the side walls 14a. The embodiment shown in FIG. 6 is designed to have a gap of about 10 µm between the support 16b and the side wall 14a. Accordingly, setting the lens 16 with the outer shape shown in FIG. 6 into the space 14d, the optical axis of the lens 16 may be aligned with the axis of the lens carrier 14 within mechanical accuracy. The lens body 16a of the embodiment is aspheric, that is, the lens 16 of the present embodiment is an aspheric lens. The slop block 14c makes an angle of substantially 45° with respect to the bottom 14e of the lens carrier 14. Therefore, the light passing through the lens 16 and entering the mirror 15 may be bent in the optical axis thereof by 90°, and advances upward.

Figure 7:
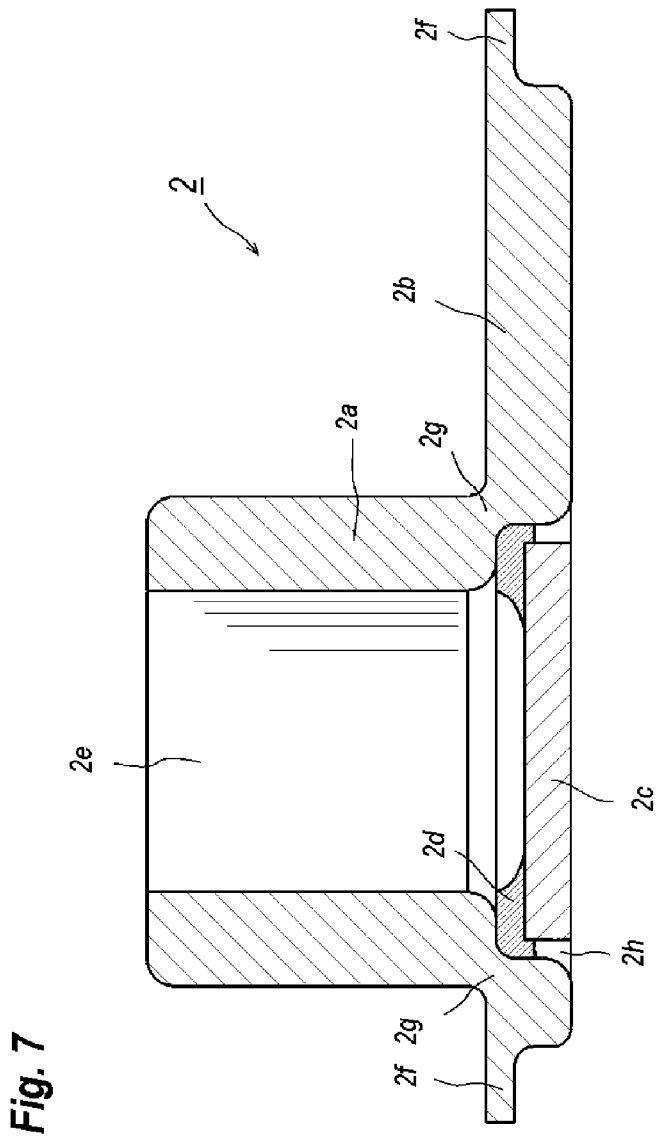
FIG. 7 is a cross section of a lid provided in the optical module.

FIG. 7 is a cross section of the lid 2. The lid 2 includes a cylinder 2a with a bore 2e in a center thereof and a ceiling 2b. The ceiling 2b provides a hollow 2h into which a window 2c with a planar shape is fixed with seal glass 2d so as to cover the bore 2e. The seal glass 2d is only stuck in a periphery of the window so as to secure the optical path from the mirror 15.

The periphery 2f of the ceiling 2b is formed thinner to be welded with the seal ring 1c of the package 1. Further, a portion 2g between the cylinder 2a and the ceiling 2b is formed also thinner, which shows a function to ease the stress affected to the sealed portion between the seal ring 1c and the periphery 2f. That is, the sleeve member 4 and the J-sleeve 3 are mechanically fixed to an apparatus that installs this optical module to secure the optical coupling with the external fiber, while, the ceramic package 1 is also necessary to be mechanically positioned with respect to the transceiver; thus the optical subassembly including the optical module and the package is mechanically fixed to the transceiver in both ends thereof, which concentrates the stress on a portion between the fixed ends. When the lid 2 has no portions whose thickness is thin between the cylinder 2a and the ceiling 2b, the stress may propagate the portion 2f to be sealed with the seal ring 1c, which causes the degradation of the air-tightness in the space 10. The optical module according to the present embodiment provides a thinner portion 2g between the cylinder 2a and the ceiling 2b to absorb the stress propagated from the J-sleeve 3 and the sleeve member 4. The thickness of the portion 2g may be less than the thickness of the cylinder 2a and that of the ceiling 2b.

Figure 8:
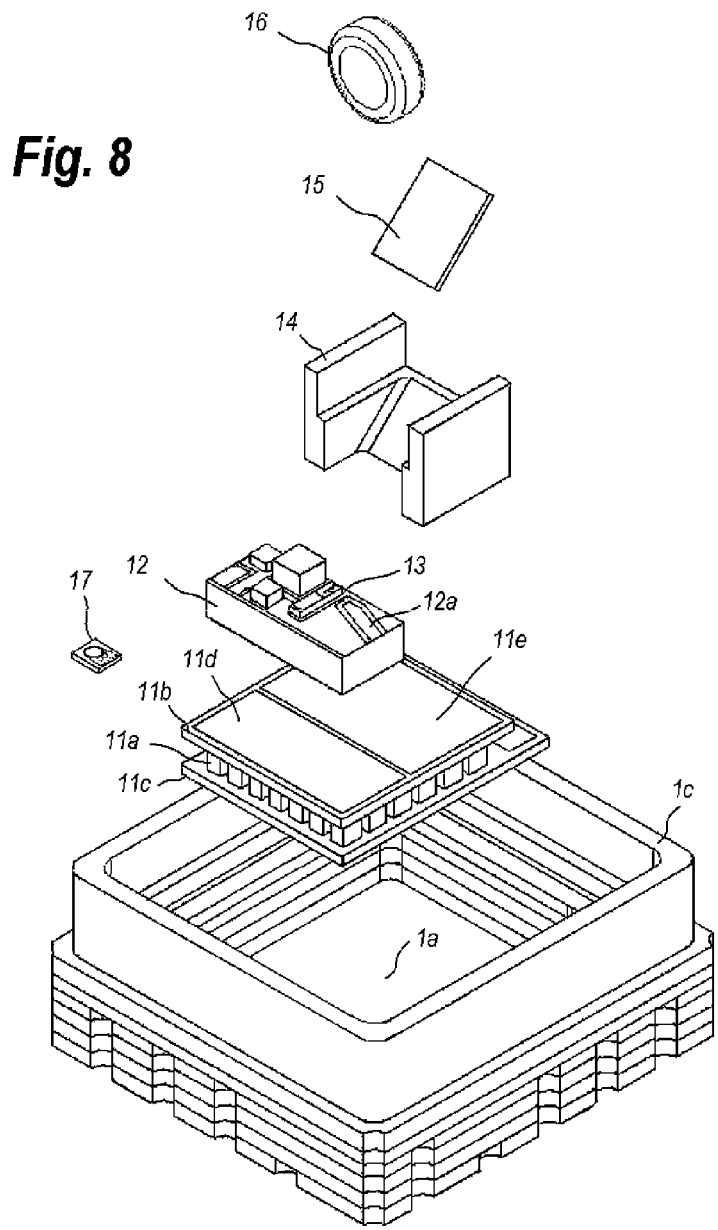
FIG. 8 is an exploded view of the optical module according to an embodiment of the invention.
Figure 9:
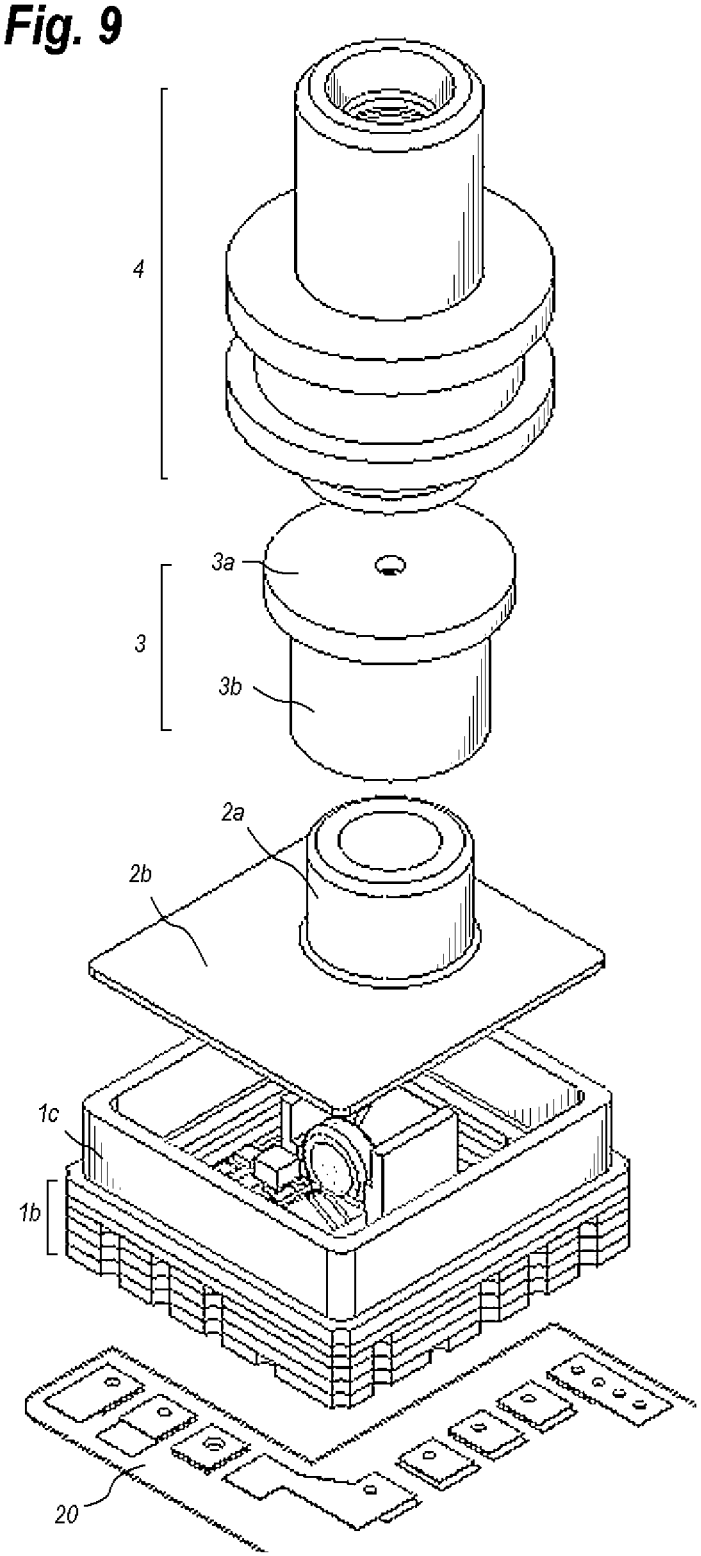
FIG. 9 is an exploded view of the optical sub-assembly according to an embodiment of the invention.

FIGS. 8 and 9 explain a method to assemble the optical module of the present embodiment. As shown in FIG. 8, the device carrier 12 first mounts the LD 13 and other electronic components thereof by, for example, a conventional die-bonding technique. The die-bonding may use a eutectic alloy of, for instance, tin-silver-copper (SnAgCu). The device carrier 12 provides the interconnection 12a thereon and the LD 13 is wire-bonded with the interconnection 12a. This intermediate assembly is subsequently mounted on the upper plate 11b of the TEC 11. Provided on the upper plate 11b of the TEC 11 is two conductive pads, 11d and 11e, and the intermediate assembly described above will be mounted on the pad 11d. Next, the TEC 11 with the intermediate assembly mounted thereon is installed on the bottom metal 1a with the eutectic allow of SnAgCu mentioned above. The package 1 is mounted with the MPD 17 on the fifth ceramic layer 1b with another eutectic alloy of, for instance, tin-gold (AuSn) in advance to the installation of the TEC 11.

Concurrently with the assembly of the TEC 11, the lens carrier 14 installs the mirror 15 on the slope 14c and the lens 16 between the side walls 14a. The installation of the mirror 15 and the lens 16 are performed by, for instance, an ultraviolet curable resin. The lens 16 has a full width slightly less than a space between the side walls 14a, and the full height of the lens 16 is adjusted such that, when the lens 16 is set on an imaginary plane extended from the bottom 14e of the lens carrier 14, the center of the lens body 16a coincides with the optical axis of the LD 13. Accordingly, placing the lens carrier 14 on the reference plate and inserting the lens 16 with the ultraviolet curable resin in both sides of the support 16b into the space 14d between the side walls 14a so as to set the bottom of the supper 16 comes in contact with the reference plate, the optical alignment of the lens with respect to the lens carrier 14 may be automatically performed. Because the gap between the side of the supper 16b and the inside of the side wall 14a is so slight, the parallelism of the lens 16 to the optical axis may be aligned within the tolerance of the gap, and the tilt along the optical axis may be determined by the flatness of the bottom of the support 16b. The step 14b of the side wall may absorb a surplus resin.

The lens carrier assembly thus assembled with the mirror 15 and the lens 16 is mounted on the TEC 11 in the package 1. Setting the visual monitoring mechanism above the mirror and monitoring the image of the LD 13 reflected by the mirror 15, the lens carrier assembly may be aligned so as to set the image of LD 13 in the center by sliding the lens carrier assembly on the pad 11e of the TEC 11. Curing the resin after the alignment, the lens carrier assembly may be fixed on the upper plate 11b of the TEC 11. FIG. 8 illustrates the pad 11e where the lens carrier assembly is to be mounted thereon; the upper plate 11b may directly mount the lens carrier assembly. The pads, 11d and 11e, may strengthen the adhesiveness of the carrier.

Next, the lid 2 is seam-sealed with the seal ring 1c so as to secure the air-tightness of the space 10. The lid 2 attaches the window 2c in advance to the seam-sealing. Subsequently, the J-sleeve 3 in the skirt 3b thereof covers the cylinder 2a and the sleeve member 4 is aligned with the top 3a of the J-sleeve 3. The YAG laser welding may typically carry out the fixing of members. Finally, the FPC 20 is soldered on the bottom of the package 1 to complete the optical module according to the present embodiment.

First Modification

Figure 10:
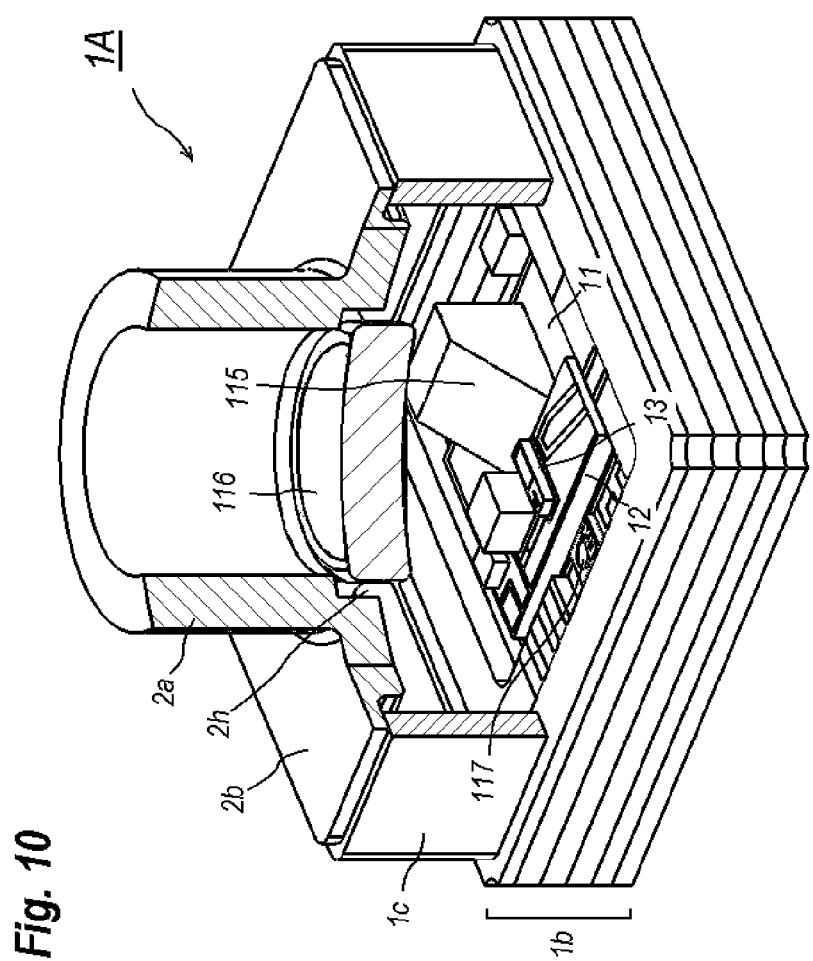
FIG. 10 illustrates a modified optical module according to another embodiment of the invention.

FIG. 10 is a perspective view showing another optical module 1A according to one modification of the embodiment. FIG. 10 is partially broken to illustrate the inside of the module 1A. The optical module 1A has a distinguishable feature, compared to aforementioned module shown in FIG. 4, of a point that the module 1a does not provide the lens carrier 14. That is, the light emitted from the LD 13 directly enters the mirror 115 with the configuration of a prism made of, for example, glass with a metal coating in the mirror surface thereof. The incident surface of the prism mirror 115 has an angle of 45° to the bottom surface thereof, thus, the outgoing light reflected by the mirror surface advances upward. The optical module 1A of the present embodiment provides an aspheric lens 116 in stead of the window 2c of the aforementioned embodiment set in the hollow 2h of the lid 2 with the seal glass to secure the air-tightness of the inside space 10.

Power consumption by the TEC 11 strongly depends of the heat capacity of the components mounted thereon. The power consumption of the TEC 11 may be reduced as the heat capacity of the components becomes small. Moreover, the response of the temperature control of the TEC 11 may be faster as the heat capacity becomes small. The aforementioned module mounts the lens carrier 14 with the lens 16 and the mirror 15 on the TEC 11, while, the modified optical module shown in FIG. 10 only mounts the mirror 115 on the TEC 11, which makes it possible not only to apply a smaller TEC 11 but to enhance the accuracy and the response of the temperature control.

Moreover, the optical module 1A changes the position of the MPD 117. As illustrated in the cross section of FIG. 3, the aforementioned module mounts the MPD 17 on the fifth ceramic layer 1b. While, the present module 1A mounts the MPD 117 on the fourth ceramic layer 1b, which makes the solid angle viewed from the back facet of the LD 13 large and enhance the monitoring efficiency of the back facet light by the MPD 117.

The optical module 1A according to the present embodiment hermetically seals the inside 10 thereof by the lens 116 not the window 2c of the former module, which not only cuts the number of the components but, because the lens 116 becomes apart from the LD 13 compared to the former embodiment, enhances the accuracy of the optical alignment although the aperture of the lens 116 is necessary to be widen.

Second Embodiment

Figure 11:
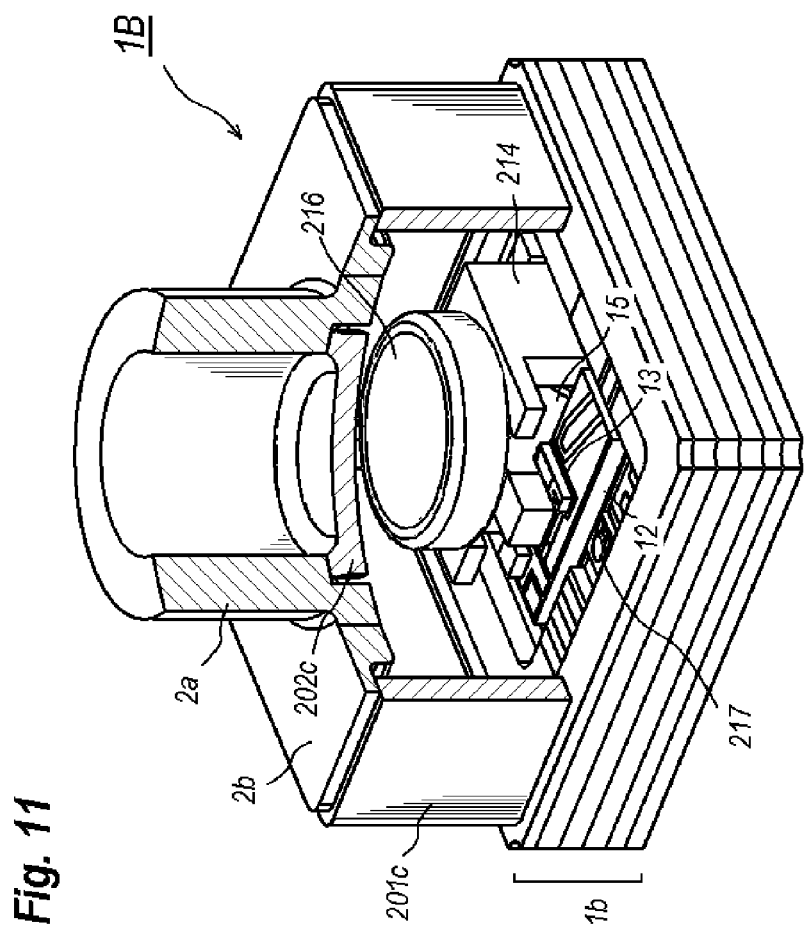
FIG. 11 illustrates an optical module according to still another embodiment of the invention.

FIG. 11 is a perspective view showing an optical module 1B according to another embodiment of the invention. The optical module 1B shown in FIG. 11 has a distinguishable feature in a point that the module 1B has a lens carrier 214 and a lens 216 on the carrier 214. The light emitted from the LD 13 first enters the mirror 15 as those in the last embodiment 1A shown in FIG. 10, and advances upward by being reflected by the mirror. The optical module 1B of the embodiment provides the window 202c in the lid 2 but the lens 216 on the lens carrier 214. Thus, the module 1B may make the distance form the LD 13 to the lens long, which forces the aperture of the lens 216 large but enhance the accuracy of the alignment between the lens 216 and the LD 13.

Because the lens carrier 214 mounts the lens 216 on the top thereof, the total height of the lens carrier assembly is forced to be large. The height of the seal ring 1c of the module 1B is set higher compared to those aforementioned modules to compensate the increase of the height of the lens carrier assembly. The optical module 1B of the embodiment may enhance the accuracy of the optical alignment of the lens 216 although the diameter of the lens 216 and the height of the package 1 are forced to be large.

Third Modification

Figure 12:
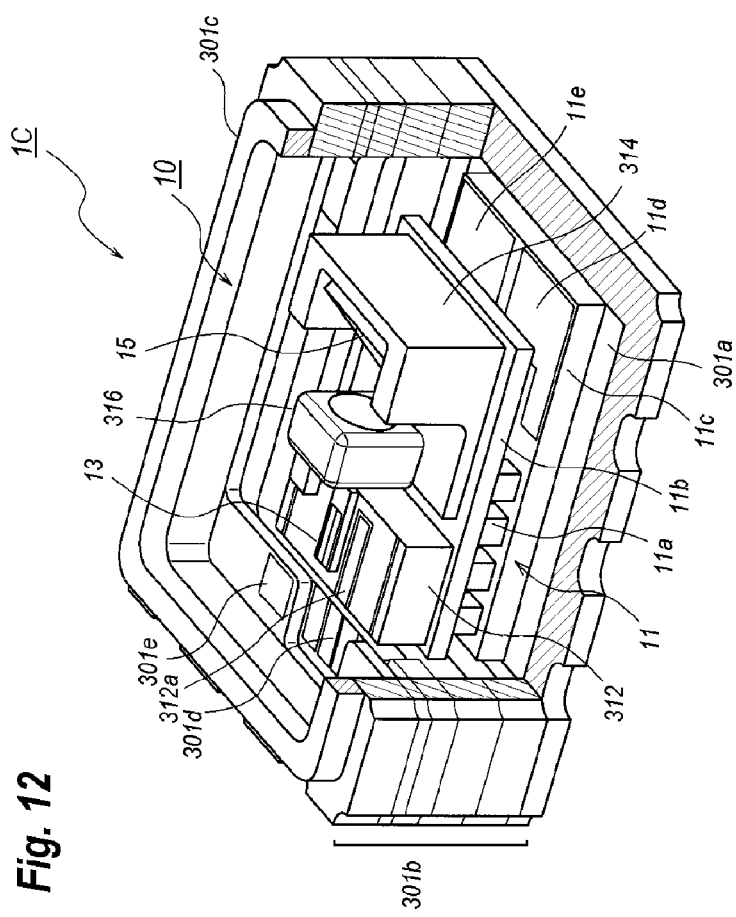
FIG. 12 illustrates an optical module according to one embodiment of the invention.

FIG. 12 shows another optical module 1C according to the fourth embodiment of the invention. The module 1C has distinguishable features in points of the package 301, the device carrier 312, the lens carrier 314, and the lens 316 compared to those aforementioned embodiments. That is, the ceramic package 1b of the present embodiment also has 6 ceramic layers, but thicknesses of respective layers are different from those in the former embodiment, and the total thickness thereof also becomes greater than that of the former embodiments; accordingly, the seal ring 301c on the uppermost ceramic layer becomes thinner.

As already described, the seal ring may be made of Kovar and becomes harder to secure the mechanical strength as the thickness thereof becomes greater. The optical module 1C makes the thickness of the seal ring 1c thinner but those of the ceramic layer 301b become greater to compensate the decrease of the thickness to secure an enough inner space 10. Thus, the capacity of the inner space 10 of the present embodiment becomes comparable to those in the aforementioned embodiments.

Installed within the inner space 10 is the TEC 11, the device carrier 312 with the LD 13 thereon, the lens carrier 314 with the mirror 15 and lens 136 thereon. The carrier 312 provides, in addition to the LD 13, an interconnection 312a thereon extending rearward, where the frontward corresponds to a direction of the front facet of the LD 13, and the rearward corresponds to the opposite direction of the back facet of the LD 13. Another interconnection 301d to be wire-bonded with the interconnection 312a is provided on the fourth ceramic layer 301b of the package 301. The horizontal level of the fourth ceramic layer is substantially equal to the level of the top of the device carrier 312, which makes a length of the bonding wire connecting therebetween shortest and reduces the parasitic inductance inherently attributed to the bonding wire.

The TEC 11 of the present embodiment arranges the TEC elements 11a in bias. Specifically, the TEC elements 11a are arranged only in portions beneath the device carrier 312. This is because the device to be controlled in a temperature thereof is only the LD 13, and the lens carrier 314 with the lens 316 and the mirror 15 has only subsidiary issue to control the temperature thereof. A space is formed beneath the lens carrier 314, and two electrodes, 11d and 11e, are formed on the bottom plate 11c in the space. The TEC 11 of the present embodiment is also directly mounted on the bottom metal 301a as those in the former embodiments.

Figure 13A:
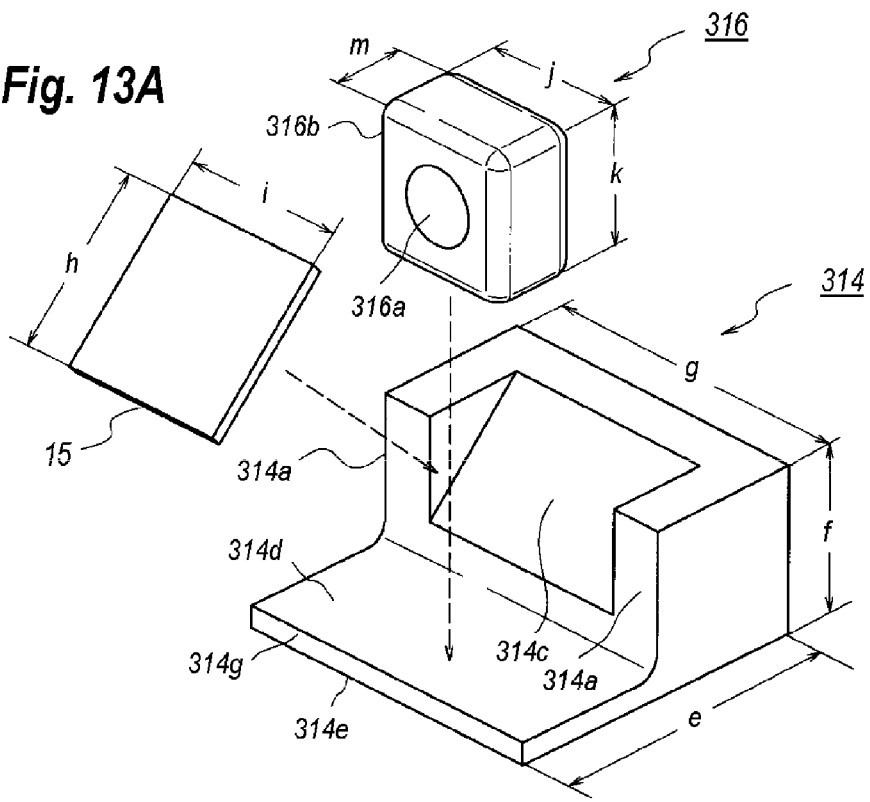
FIG. 13A is an exploded view of an intermediate assembly of the lens, the mirror and the lens carrier, which are installed in the optical module shown in FIG. 12.
Figure 13B:
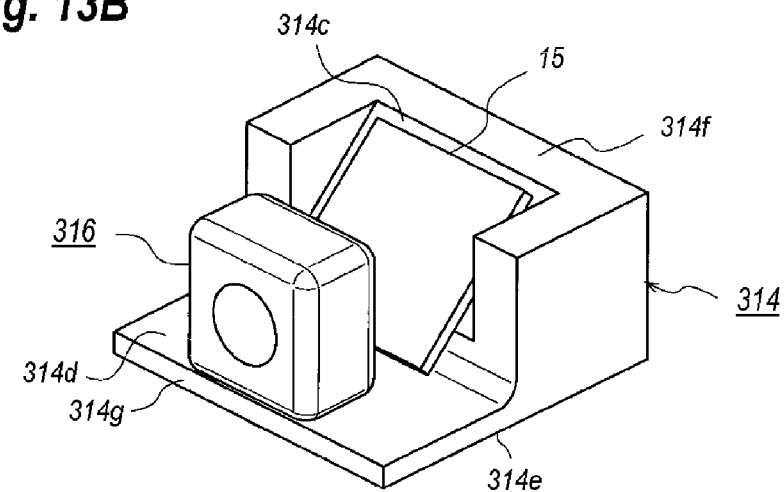
FIG. 13B is a perspective view of the intermediate assembly illustrated in FIG. 13A.

FIGS. 13A and 13B explain the lens carrier assembly of the present embodiment, where FIG. 13A is an exploded view and the FIG. 13B is a perspective view. The lens carrier 314 of the present embodiment provides a pair of side walls 314a, a slope 314c between the walls 314a to mount the mirror 15 thereon, and extends the installing space 314d from the bottom of the slope 314c. The lens carrier 314 has dimensions of about 1.6×2.2×1.0 mm³ [length (e)×width (g)×height (f)]. The bottom 314e is the optically reference plane as those of the aforementioned lens carriers. The slope 314c makes an angle of 45° with respect to the bottom 314e, while, the space 314d is substantially in parallel to the bottom 314e.

The lens 316 provides the lens body 316a in a center thereof and the support 316b surrounds the lens body 316. The support 316b of the present embodiment has a rectangular arrangement with a dimension of about 0.8×1.0×1.0 mm³ [length (m)×width (j)×height (k)]; while, the mirror 15 has a dimension of 1.5×1.5 mm² [length (h)×width (i)]. The lens 316 is mounted on the space 314d such that the front edge of the support 316b aligns with the front edge 314g of the lens carrier 314. Moreover, setting the lens carrier 314 with the lens 316 on the TEC 11 such that the front edge 314e thereof is aligned with the device carrier 312, the alignment between the LD 13 and the lens 316 may be performed. Next, various types of the lens and the lens carrier will be described.

Figure 14A:
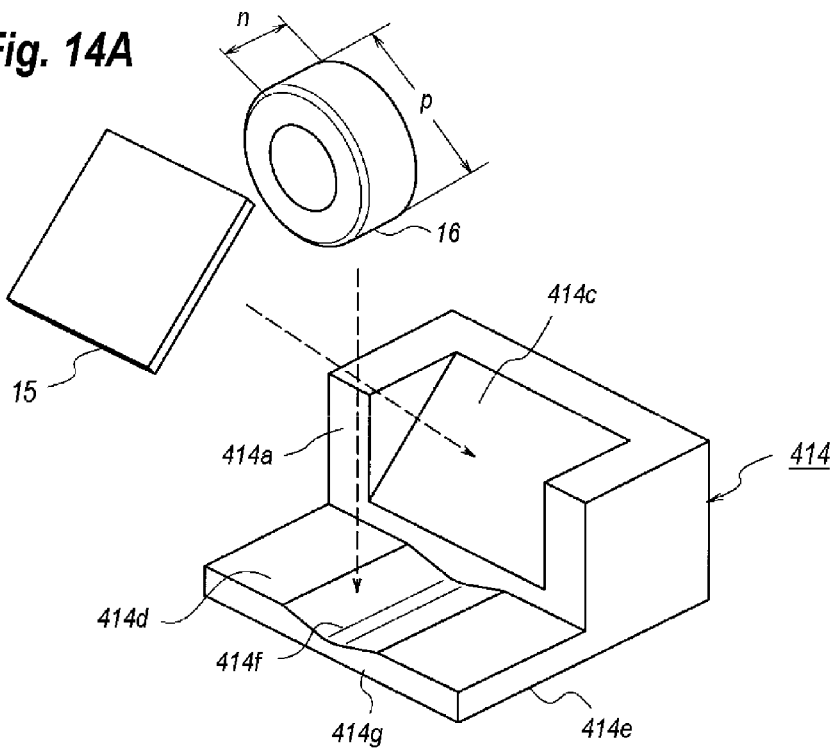
FIG. 14A is an exploded view of an intermediate assembly with a modified lens carrier.
Figure 14B:
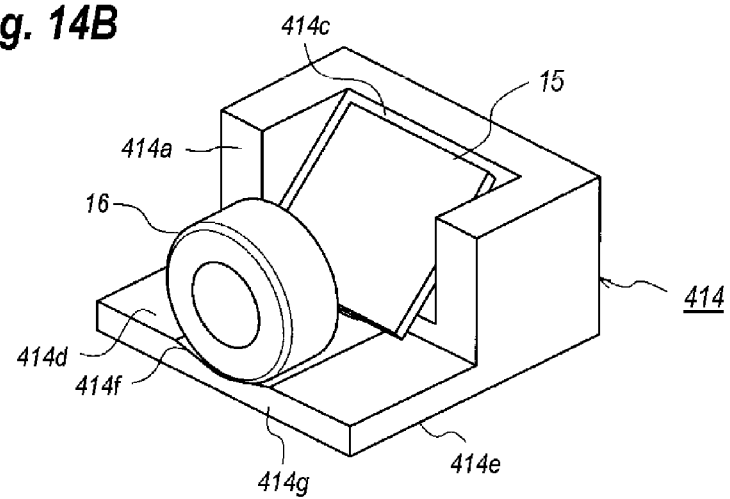
FIG. 14B is a perspective view of the intermediate assembly.

FIG. 14A is an exploded view of another lens carrier 414 with a lens 16 and the mirror 15, while, FIG. 14B is a perspective view of the lens carrier assemble. The lens carrier 414 of the present embodiment has a feature in the lens mounting space 414d. The lens 16 of the present embodiment is same with that of the first embodiment. Specifically, the lens 16 provides the lens body 16a in the center thereof and the support 16b surrounding the lens body 16a. The support 16b has the cylindrical shape.

The lens carrier 414 provides the side walls 414a but the side walls 414a do not extends in the side of the device mounting space 414d. The side walls 414a only secure the side of the mirror 15. The lens mounting space 414d provides a hollow 41f in center thereof to set the lens 16 herein. This arrangement of the hollow 414f and the cylindrical support may automatically align the position of the lens 16. Aligning the edge of the support 16b with the front edge 414g of the lens carrier 414, and aligning the front edge 414g with the device carrier 12, the distance between the LD 13 and the lens 416 may be determined. The lens 16 of the present embodiment has dimensions of 1.0×0.8 mm³ [diameter (p)×thickness (n)]

Figure 15A:
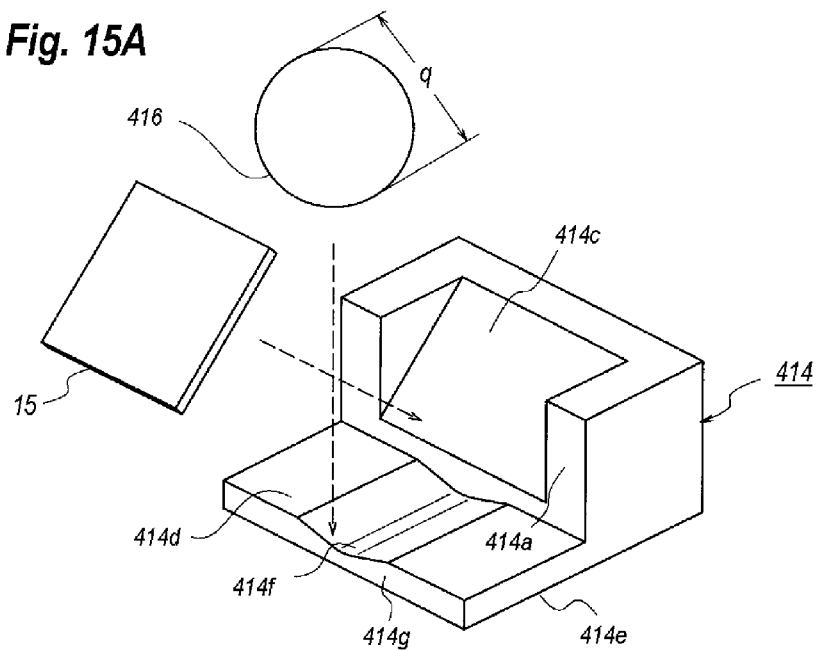
FIG. 15A is an exploded view of the intermediate assembly with the lens carrier shown in FIGS. 14A and 14B but the lens thereof is substituted to a spherical lens.
Figure 15B:
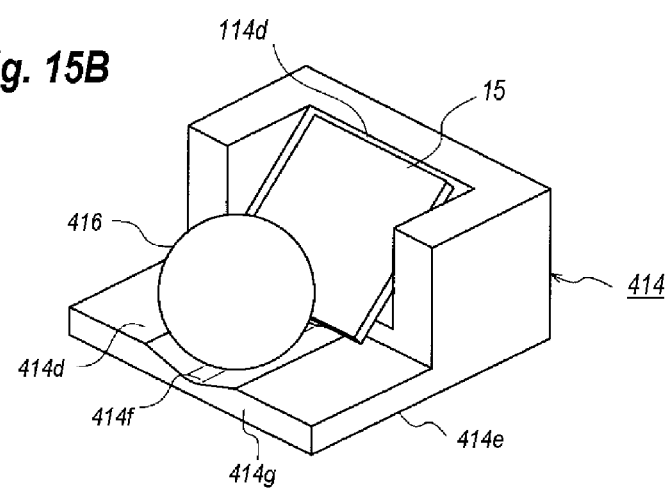
FIG. 15B is a perspective view of the intermediate assembly shown in FIG. 15A.

FIG. 15A is an exploded view of the lens carrier assembly with another type of lens, while, FIG. 15B is a perspective view of the lens carrier assembly. This assembly has the other type of lens 416 with a spherical shape. The lens 416 is set within the hollow 414f in the mounting space 414d. Accordingly, even the spherical lens 416 without any support member, the position of the lens 416 may be easily determined by aligning the edge of the lens 416 with the front edge 414f of the mounting space 414d. Alignment in a direction perpendicular to the axis connecting the LD 13 and the lens 416 is determined by the diameter of the lens 416, and the width and the depth of the hollow 414f. The lens 416 of the present embodiment has the diameter [q] of 1.5 mm.

Figure 16A:
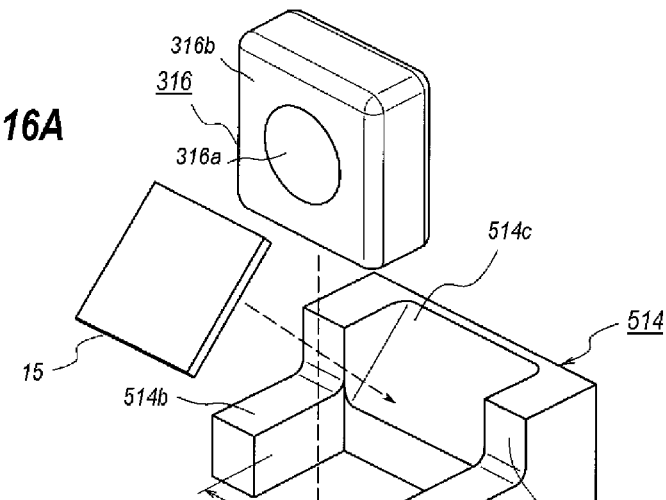
FIG. 16A is an exploded view of an intermediate assembly with a modified lens carrier.
Figure 16B:
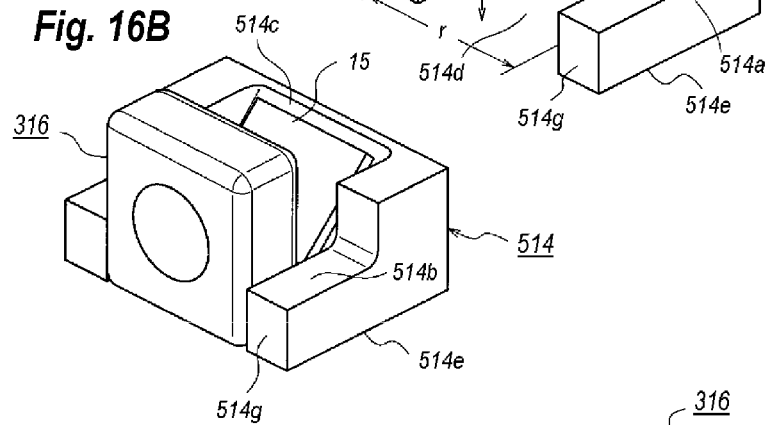
FIG. 16B is a perspective view of the intermediate assembly shown in FIG. 16A.
Figure 16C:
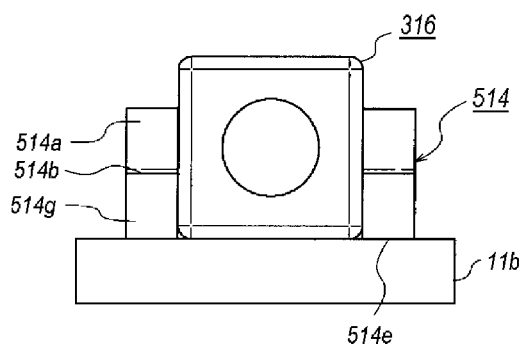
FIG. 16C is a front view of the assembly.

FIGS. 16A to 16C show another type of the lens and the lens carrier according to the present invention. The lens 316 of the present embodiment is same with that explained in the former embodiment and has the rectangular support 316b, while, the lens carrier 514 of the present embodiment has a new feature that the lens carrier has the side walls in the side of the slope 514c but not in the side of the mounting space 154d, and no plate in the mounting space 514d as those in the first embodiment. The side wall 514a forms the step 514b in the sides of the mounting space 514d.

The lens 316 with the rectangular appearance is set on a reference plate between the side walls 514a. The reference plate also mounts the lens carrier 514 so as to set the bottom 514e thereon and to align the front end with the front edge 514g of the lens carrier 514. Because the width of the support 316b is slightly narrower than the space of the mounting space, and the bottom of the support is substantially in perpendicular to the front and rear surface of the support, the alignment of the lens 316 with the lens carrier 514, and with the LD 13 may be automatically performed as those in the first embodiment.

Figure 17A:
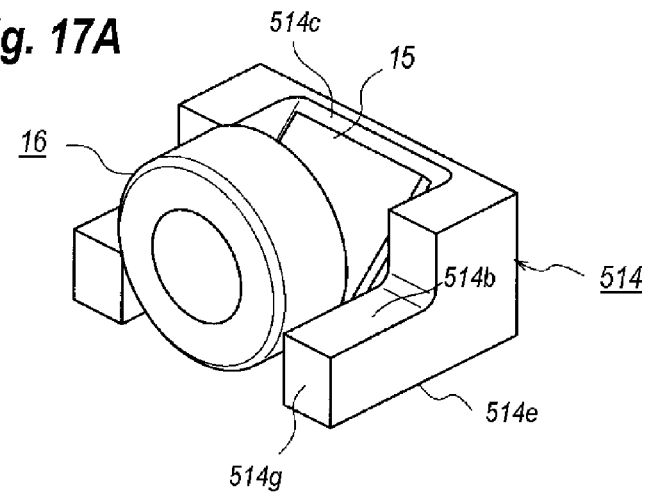
FIG. 17A is another intermediate assembly with the lens carrier shown in FIGS. 16A and 16B but the lens thereof having a cylindrical appearance.
Figure 17B:
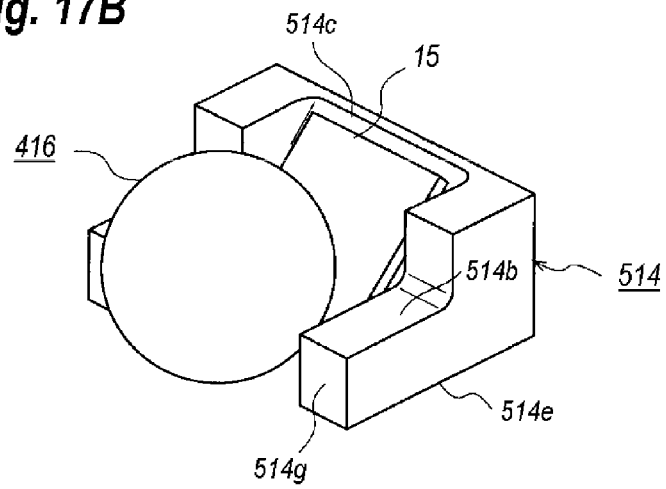
FIG. 17B is still another intermediate assembly with the lens carrier same with that shown in FIG. 17A but the lens thereof being changed to a spherical lens.

FIGS. 17A and 17B are perspective views of the lens carrier assembly with the lens carrier 514 type of that shown in FIGS. 16A to 16C but each substituting the lens thereof for that 16 in the first embodiment and the spherical lens 416, respectively. Setting the width of the support 16 or the diameter of the lens 146 slightly less than the width r shown in FIG. 16A between the side walls 514a, for instance, about 10 μm in one side, the lens, 16 or 416, may be aligned with the lens carrier 514. The step 514b in both sides may absorb the surplus adhesive such as ultraviolet curable resin to prevent the resin from spreading to the optical sensitive are of the lens.

Figure 18A:
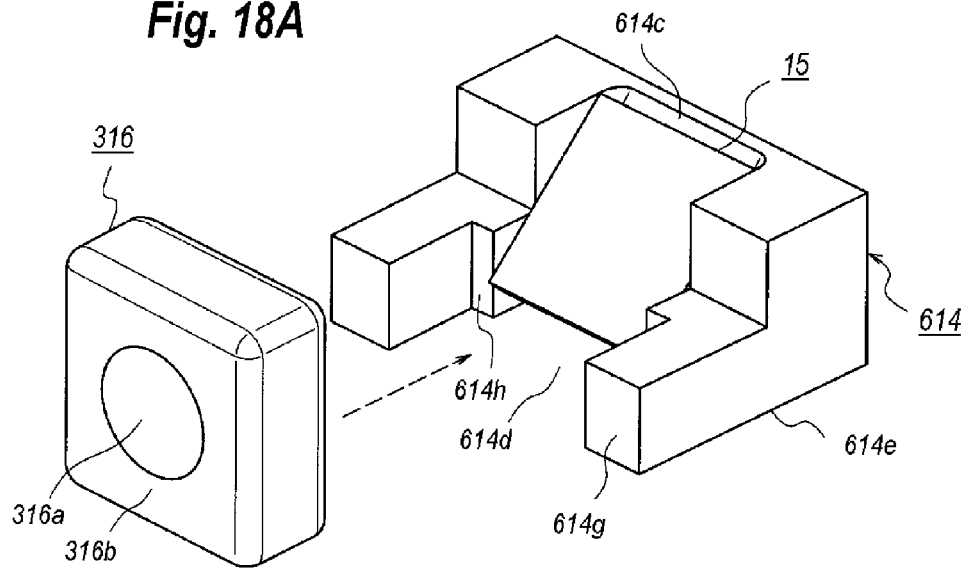
FIG. 18A is an exploded view of an intermediate assembly with a modified lens carrier.
Figure 18B:
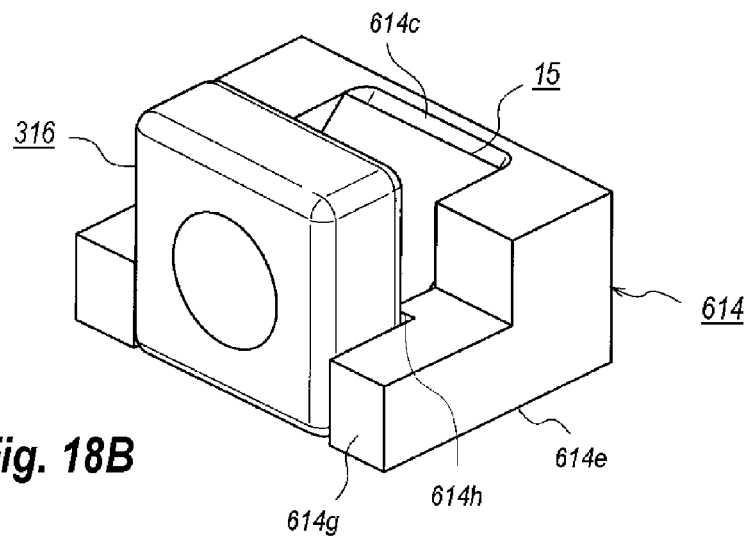
FIG. 18B is a perspective view of the assembly shown in FIG. 18A.

FIG. 18A is an exploded view showing a lens carrier with a further different arrangement and FIG. 18B is a perspective view of the lens carrier assembly. The lens carrier 614 of the present embodiment has a distinguishable feature, compared to that 514 shown in FIG. 17A, that the side wall 614a of the lens carrier 614 provides another step 614h in a deep end of the mounting space 614d. Inserting the lens 316 into the mounting space 614d from the front, the rear surface of the support 316b may abut against the step 614h, which automatically determines the relative position of the lens 316 along the optical axis. Alignment perpendicular to the optical axis may be carried out, as already explained, by the dimensions of the support 316b and the mounting space 614d, and by setting the bottom 614e of the lens carrier 614 to be the optically reference plate. Although FIGS. 18A and 18B describe a case where the lens carrier assembly provides the lens 316 with the rectangular support 316b, the lens carrier 614 of the present embodiment may assemble the lens 16 with the cylindrical support 16b. By abutting the rear surface of the support 16b against the step 614h, the position of the lens 16b automatically determined.

Fourth Modification

FIG. 19 shows a bottom of the package 101 with a modified arrangement. The package 101 according to the present embodiment has a similar feature to those of the aforementioned embodiment but has a distinguishable feature in a point that the bottom metal 1a of the present embodiment is attached to the bottom of the second ceramic layer not the bottom of the first ceramic layer as those in the former embodiment. Specifically, the first ceramic layer is widely cut so as to leave two edges where plurality of pads, 101p and 101r, is formed and the FPC 20 is attached thereto. The bottom of the ceramic layer provides the ground pattern 101m to fix the bottom metal 1a thereto. The ground pattern 101m is electrically isolated from the other ground pattern 101n on the first ceramic layer. The former ground pattern 101m provides the frame ground, while, the latter ground pattern 101n has the function of the signal ground where the latter ground pattern 101n surrounds the signal pad 101r.

When two ground patterns, 1m and 1n, are formed on the same ceramic layer as those in the first embodiment, a space is inevitable to isolate two ground patterns. On the other hand, when the ground patterns are formed on respective ceramic layers, the electrical isolation may be performed by the ceramic layer itself, which enables to arrange two patterns close enough; thus, the size of the package may be reduced.

Moreover, the package 101 shown in FIG. 19 has a cut 101g in the edge where the signal pad 101r is provided, where the half via 101h in the cut is formed only in the first and second ceramic layers and the ceramic layers above the third layer make the overhang for the cut 101g. When the FPC 20 is soldered in this edge, a solder fills in the half via 101h and spreads in the pad on the FPC 20. A portion of the FPC 20 where the solder spreads lacks the flexibility of the FPC 20 and becomes hard to bend there. Forming the cut 101q in the ceramic layer and the half via 101h in the deep end of the cut 101q, the spread of the solder on the FPC 20 may be restricted within the cut 101q, which enables the FPC 20 to be bent in a vicinity of the package 101.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An optical module, comprising:
a semiconductor optical device to emit signal light, said semiconductor optical device providing an optical axis;
a thermo-electric cooler that mounts said semiconductor optical device thereon to control a temperature of said semiconductor optical device;
a mirror and a carrier for mounting said mirror thereon, said carrier being mounted on said thermo-electric cooler; and
a multi-layered ceramic package for installing said semiconductor optical device and said thermo-electric cooler therein, said ceramic package including a bottom and a lid, said bottom extending substantially in parallel to said optical axis and said mirror reflective of said signal light toward a direction perpendicular to said bottom, said lid having a cylinder, a ceiling and a hollow in a position corresponding to said cylinder, said hollow forming a portion in said lid with a thickness thereof thinner than a thickness of said cylinder and said ceiling, and
wherein said cylinder of said lid assembles an optical coupling member to couple said signal light emitted from said semiconductor optical device and reflected by said mirror externally from said multi-layered ceramic package, and said ceiling of said lid in a periphery thereof is welded to a seal ring provided in a top of ceramic layers of said multi-layered ceramic package.

2. The optical module of claim 1,
wherein said periphery of said lid has a thickness less than said thickness of said ceiling.

3. The optical module of claim 1,
wherein said hollow of said lid is sealed with a window made of glass.

4. The optical module of claim 1,
wherein said hollow of said lid is sealed with a lens.

5. The optical module of claim 4,
wherein said lens is free from said thermo-electric cooler.

6. The optical module of claim 5,
wherein said mirror is made of prism coated with metal.

7. The optical module of claim 3, where a gap in the hollow is defined between the lid and the window.

8. The optical module of claim 4, where a gap in the hollow is defined between the lid and the lens.

* * * * *